United States Patent
Ring et al.

(10) Patent No.: US 9,934,983 B2
(45) Date of Patent: Apr. 3, 2018

(54) STRESS MITIGATION FOR THIN AND THICK FILMS USED IN SEMICONDUCTOR CIRCUITRY

(71) Applicant: Cree, Inc., Durham, NC (US)

(72) Inventors: Zoltan Ring, Chapel Hill, NC (US); Donald A. Gajewski, Cary, NC (US); Scott Thomas Sheppard, Carrboro, NC (US); Daniel Namishia, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 473 days.

(21) Appl. No.: 14/170,878

(22) Filed: Feb. 3, 2014

(65) Prior Publication Data

US 2015/0221574 A1    Aug. 6, 2015

(51) Int. Cl.
*H01L 21/31* (2006.01)
*H01L 21/762* (2006.01)
*H01L 21/311* (2006.01)
*H01L 21/768* (2006.01)
*H01L 23/522* (2006.01)
*H01L 23/00* (2006.01)
*H01L 23/29* (2006.01)
*H01L 23/31* (2006.01)
*H01L 23/532* (2006.01)

(52) U.S. Cl.
CPC ...... *H01L 21/31105* (2013.01); *H01L 21/762* (2013.01); *H01L 21/768* (2013.01); *H01L 21/76829* (2013.01); *H01L 23/5221* (2013.01); *H01L 23/562* (2013.01); *H01L 23/291* (2013.01); *H01L 23/3157* (2013.01); *H01L 23/53295* (2013.01); *H01L 2924/0002* (2013.01)

(58) Field of Classification Search
CPC . H01L 2224/00572; H01L 2224/73265; H01L 21/762; H01L 21/768; H01L 23/5381; H01L 21/76829
USPC ................................. 257/792, 750
See application file for complete search history.

(56) References Cited

U.S. PATENT DOCUMENTS

| | | | | |
|---|---|---|---|---|
| 3,493,812 A * | 2/1970 | Weimer | ................. | H01L 27/00 148/DIG. 85 |
| 4,200,892 A * | 4/1980 | Weimer | ............ | H01L 27/14645 257/294 |
| 4,332,075 A * | 6/1982 | Ota | ..................... | H01L 27/1214 257/353 |
| 4,612,580 A * | 9/1986 | Weimer | ............ | H01L 27/14843 257/231 |
| 4,675,739 A * | 6/1987 | Catchpole | ......... | H01L 27/14665 250/370.09 |
| 6,037,608 A * | 3/2000 | Kodaira | .............. | G02F 1/13454 257/59 |
| 7,161,226 B2 * | 1/2007 | Chen | ................. | G02F 1/136286 257/522 |

(Continued)

*Primary Examiner* — Jami M Valentine
(74) *Attorney, Agent, or Firm* — Anthony J. Josephson (57) ABSTRACT

A semiconductor device is configured to reduce stress in one or more film layers in the device. According to one embodiment, the semiconductor device includes a substrate, a discontinuous dielectric layer on a first surface of the substrate, and a substantially continuous encapsulation layer over the first surface of the substrate and the discontinuous dielectric layer. Notably, the dielectric layer may be broken into one or more dielectric sections in order to relieve stress in the semiconductor device.

28 Claims, 7 Drawing Sheets

(56) References Cited

U.S. PATENT DOCUMENTS

2008/0197469 A1* 8/2008 Yang ................... H01L 25/0652
                                                                              257/686

* cited by examiner

STRESS MITIGATION FOR THIN AND THICK FILMS USED IN SEMICONDUCTOR CIRCUITRY

GOVERNMENT SUPPORT

This invention was made with government funds under contract number 11-D-5309 awarded by the Department of Defense and contract number FA8650-11-2-5507 awarded by the United States Air Force. The U.S. Government may have rights in this invention.

FIELD OF THE DISCLOSURE

The present disclosure relates to semiconductor devices including one or more film layers configured to reduce stress in the device.

BACKGROUND

Semiconductor devices generally include multiple film layers. Often, differing material properties of the separate film layers generate stress in the semiconductor device, which may lead to a decrease in performance or even failure of the device. One form of stress in semiconductor devices is generated when film layers that are placed adjacent to one another have different thermal coefficients. In such a case, as the ambient temperature changes, one film layer may expand and/or contract more than an adjacent layer, thereby causing undesirable cracking, buckling, wafer bowing, or piezo-electric effects in the semiconductor device.

Figure 1:
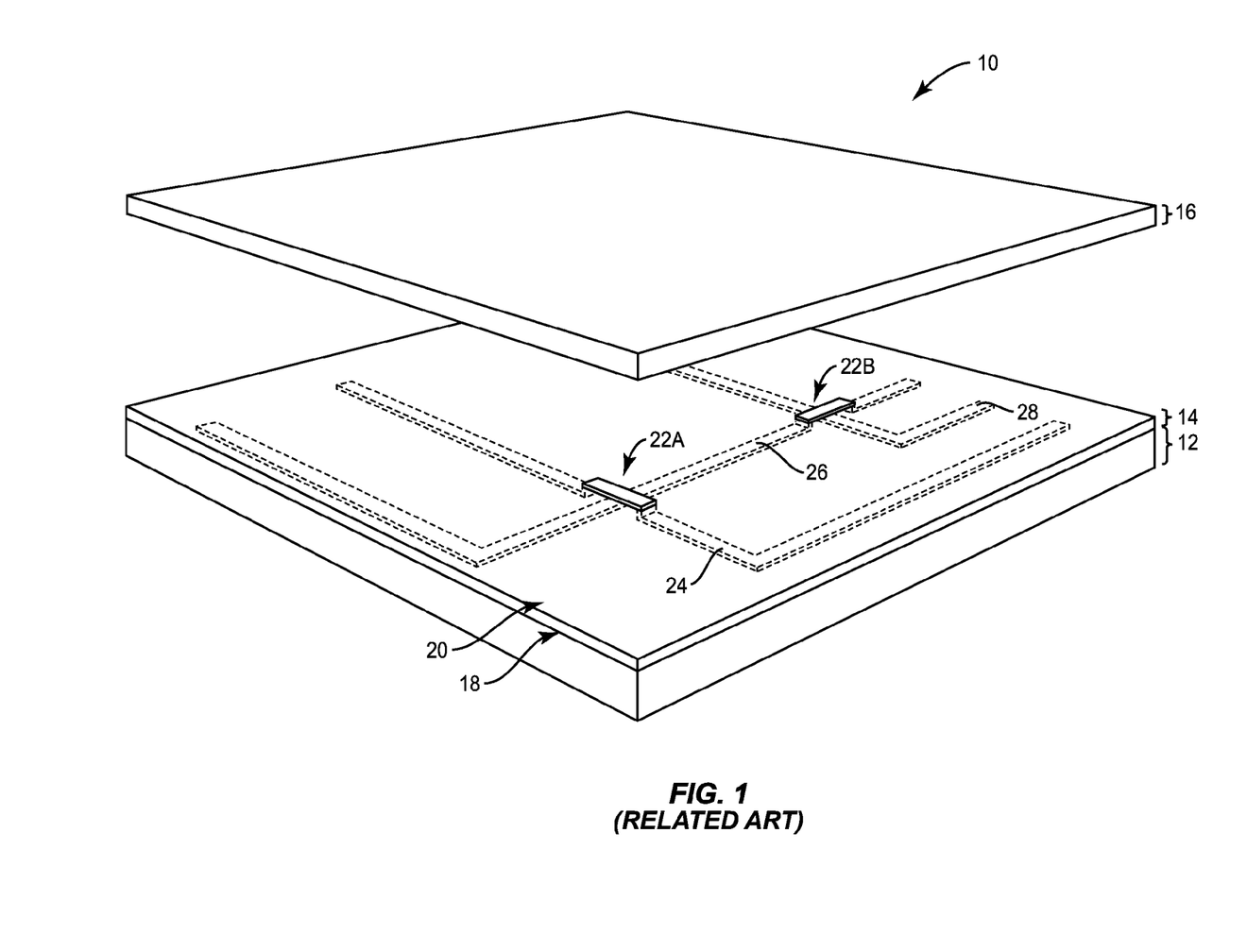
FIG. 1 shows a three-dimensional representation of a conventional semiconductor device including one or more film layers.

FIG. 1 shows a conventional semiconductor device 10 including a substrate 12, a dielectric crossover layer 14, and an encapsulation layer 16. The substrate 12 includes a first surface 18, which is used to support and connect one or more electrical components (not shown). The dielectric crossover layer 14 is located between the first surface 18 of the substrate 12 and the encapsulation layer 16. The dielectric crossover layer includes a dielectric surface 20, which is used to support a number of crossovers 22, such as a first crossover 22A and a second crossover 22B.

The first crossover 22A may include the dielectric crossover layer 14, a first conductive trace 24, and a second conductive trace 26. The second crossover 22B may include the dielectric crossover layer 14, the second conductive trace 26, and a third conductive trace 28. In the first crossover 22A, the first conductive trace 24 may be a crossover trace, while the second conductive trace 26 may be a surface trace, such that the first conductive trace 24 crosses over the second conductive trace 26 on the dielectric surface 20 of the dielectric crossover layer 14. In the second crossover 22B, the second conductive trace 26 may be a crossover trace, while the third conductive trace 28 may be a surface trace, such that the second conductive trace 26 crosses over the third conductive trace 28 on the dielectric surface 20 of the dielectric crossover layer 14. The solid lines shown in FIG. 1 represent the portion of the first conductive trace 24 and the second conductive trace 26 located on the dielectric surface 20 of the dielectric crossover layer 14, while the dotted lines represent the portions of the first conductive trace 24, the second conductive trace 26, and the third conductive trace 28 located below the dielectric surface 20 of the dielectric crossover layer 14.

Figure 2:
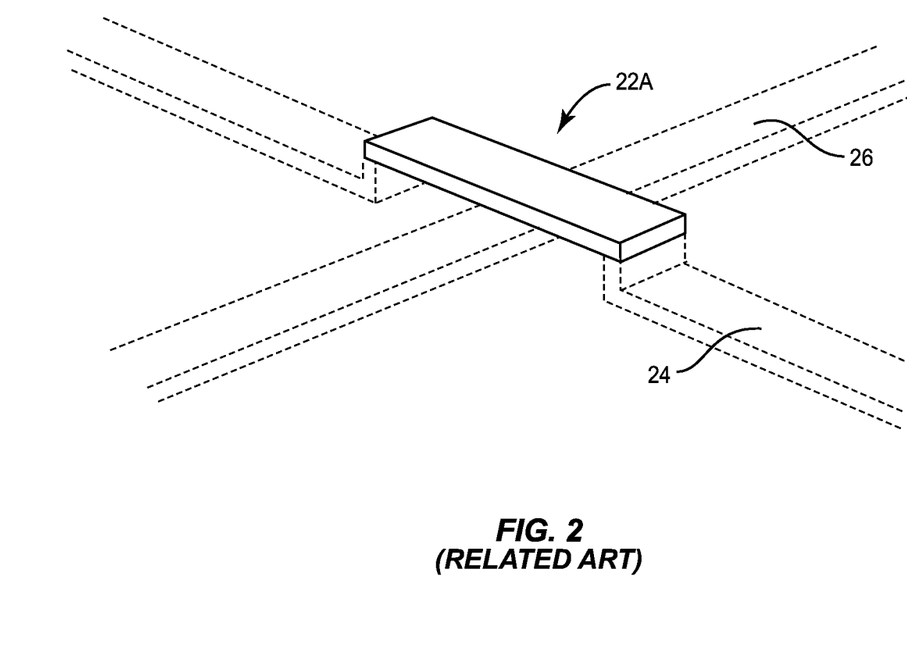
FIG. 2 shows an expanded view of a conventional crossover shown in the conventional semiconductor device of FIG. 1.

FIG. 2 shows details of the first crossover 22A, which includes a portion of the dielectric crossover layer 14, the first conductive trace 24, and the second conductive trace 26. As discussed above, the first conductive trace 24 is a crossover trace, which crosses over the second conductive trace 26 on the dielectric surface 20 of the dielectric crossover layer 14, while the second conductive trace 26 is a surface trace, which runs under the first conductive trace 24 on the first surface 18 of the substrate 12. Specifically, the first conductive trace 24 is partially disposed on the first surface 18 of the substrate 12 and the dielectric surface 20 of the dielectric crossover layer 14, such that the first conductive trace 24 crosses over the second conductive trace 26 on the dielectric surface 20. Notably, the dielectric crossover layer 14, which separates the first conductive trace 24 and the second conductive trace 26 to prevent contact between the two, is a blanket layer that substantially extends over the periphery of the first surface 18 of the substrate 12. Accordingly, the solid lines shown in FIG. 2 represent the portion of the first conductive trace 24 located on the dielectric surface 20 of the dielectric crossover layer 14, while the dotted lines represent the portions of the first conductive trace 24 and the second conductive trace 26 located below the dielectric surface 20 of the dielectric crossover layer 14.

Although effective at supporting the first crossover 22A and the second crossover 22B in the conventional semiconductor device 10, the dielectric crossover layer 14 often generates stress in the semiconductor device. This may be, for example, due to the fact that the dielectric crossover layer 14 and the encapsulation layer 16 are blanket layers that often have divergent thermal coefficients. As discussed above, the dielectric crossover layer 14 or the encapsulation layer 16 may thus expand and/or contract more than the other, thereby leading to undesirable cracking, buckling, wafer bowing, or piezo-electric effects in the semiconductor device which may lead to a decrease in performance or even failure of the device.

As feature sizes in semiconductor devices decrease and wafer sizes increase, stress in the semiconductor device becomes increasingly problematic. Accordingly, there is a need for a semiconductor device with reduced stress between the film layers therein.

SUMMARY

The present disclosure relates to a semiconductor device configured to reduce stress in one or more film layers in the device. According to one embodiment, the semiconductor device includes a substrate, a discontinuous dielectric layer on a first surface of the substrate, and a substantially continuous encapsulation layer over the first surface of the substrate and the discontinuous dielectric layer. Notably, the dielectric layer may be broken into one or more dielectric sections in order to relieve stress in the semiconductor device.

By providing a discontinuous dielectric layer that is broken into one or more dielectric sections, stress between the substrate and the dielectric layer, as well as stress between the encapsulation layer and the dielectric layer, is localized to each one of the dielectric sections, thereby reducing the overall stress in the semiconductor device.

According to one embodiment, the dielectric layer is a dielectric crossover layer for supporting one or more crossovers in the semiconductor device.

According to one embodiment, the semiconductor device includes a substrate and one or more crossovers. Each one of the crossovers may include a surface trace on a first surface of the substrate, a dielectric crossover section covering a portion of the surface trace and having a dielectric surface opposite the first surface of the substrate, and a crossover trace partially disposed on a portion of the surface of the substrate and a portion of the dielectric surface, such that the crossover trace crosses over the surface trace on the dielectric surface. Notably, each dielectric crossover section of each of the one or more crossovers forms a discontinuous dielectric crossover layer in order to reduce stress in the semiconductor device.

According to one embodiment, the first surface of the substrate and the crossovers are covered by a substantially continuous encapsulation layer.

According to one embodiment, a method of manufacturing the semiconductor device begins by providing a substrate. A surface trace is then provided on a first surface of the substrate. A dielectric crossover layer is provided over the first surface of the substrate and the surface trace, and subsequently etched to form one or more dielectric crossover sections having a dielectric surface opposite the first surface of the substrate, such that each of the one or more dielectric crossover sections forms a discontinuous dielectric crossover layer. Finally, a crossover trace is provided on a portion of the first surface of the substrate and the dielectric surface of one of the dielectric crossover sections, such that the crossover trace crosses over the surface trace on the dielectric surface.

According to one embodiment, the first surface of the substrate and the crossovers are covered by a substantially continuous encapsulation layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
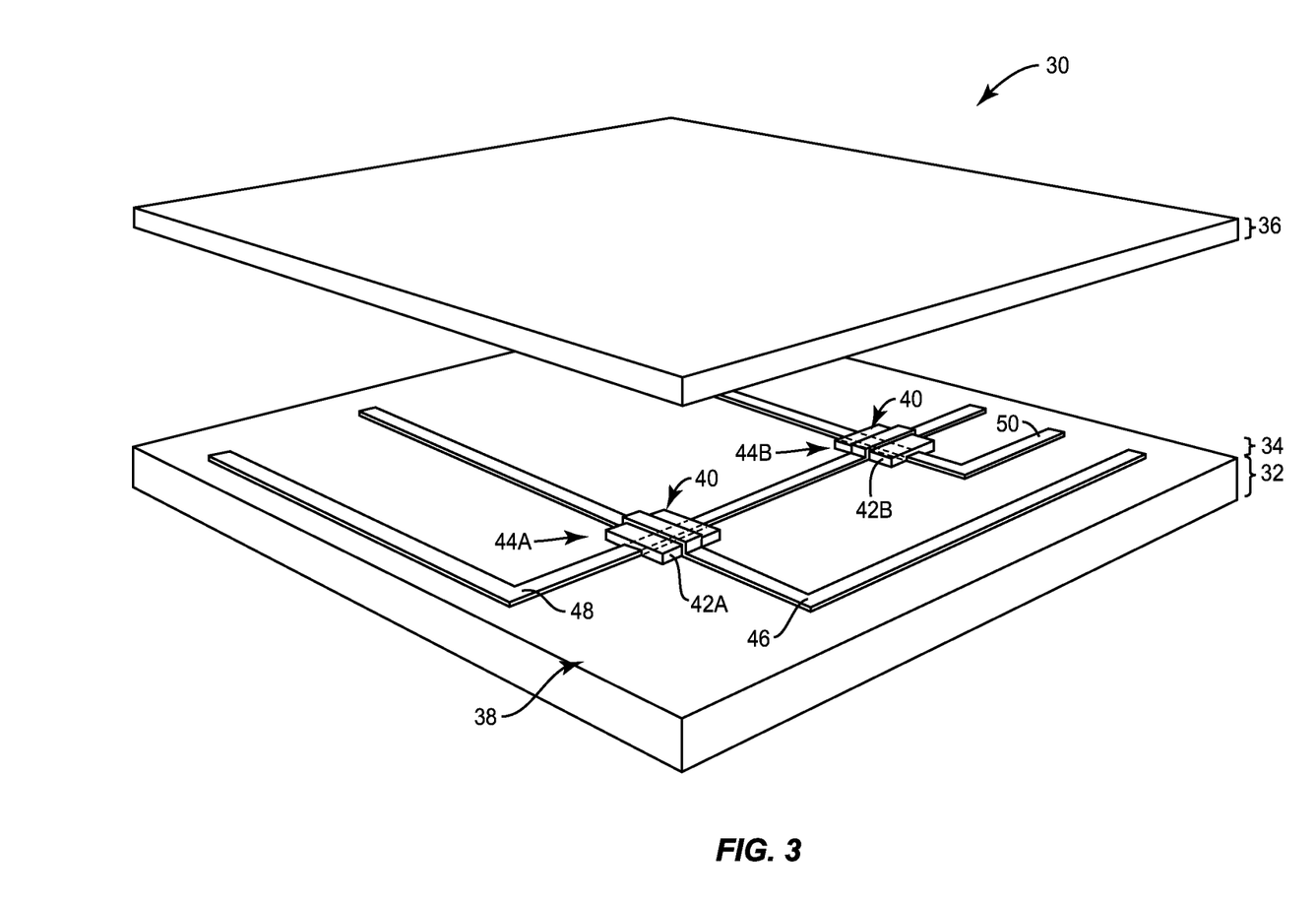
FIG. 3 shows a three-dimensional representation of a semiconductor device according to one embodiment of the present disclosure.

Turning now to FIG. 3, a semiconductor device 30 is shown according to one embodiment of the present disclosure. The semiconductor device 30 includes a substrate 32, a discontinuous dielectric crossover layer 34, and an encapsulation layer 36. The substrate 32 includes a first surface 38, which is used to support and connect one or more electrical components (not shown). The discontinuous dielectric crossover layer 34 is located between the first surface 38 of the substrate 32 and the encapsulation layer 36. Further, the discontinuous dielectric crossover layer 34 is broken into a number of dielectric crossover sections 42, each of which includes a dielectric surface 40 opposite the first surface 38 of the substrate 32 and used to support one or more crossovers 44, such as a first crossover 44A and a second crossover 44B.

The first crossover 44A may include a first dielectric crossover section 42A, a first conductive trace 46, and a second conductive trace 48. The second crossover 44B may include the second conductive trace 48, a second dielectric crossover section 42B, and a third conductive trace 50. In the first crossover 44A, the first conductive trace 46 may be a crossover trace, while the second conductive trace 48 may be a surface trace, such that the first conductive trace 46 crosses over the second conductive trace 48 on the dielectric surface 40 of the first dielectric crossover section 42A. In the second crossover 44B, the second conductive trace 48 may be a crossover trace, while the third conductive trace 50 may be a surface trace, such that the second conductive trace 48 crosses over the third conductive trace 50 on the dielectric surface 40 of the second dielectric crossover section 42B.

The first conductive trace 46, the second conductive trace 48, and the third conductive trace 50 may form or connect one or more electrical components (not shown) on the first surface 38 of the substrate 32. Although only three conductive traces are shown in FIG. 1, those of ordinary skill in the art will appreciate that the principles of the present disclosure are applicable to a semiconductor device having any number of conductive traces.

In some embodiments, each of the dielectric crossover sections 42 of the discontinuous dielectric crossover layer 34 are confined to the immediate vicinity of the crossover which they support, as will be discussed in further detail below. By breaking the discontinuous dielectric crossover layer 34 into a plurality of dielectric crossover sections 42, stress caused by the interaction between the substrate 32 and the discontinuous dielectric crossover layer 34 or between the encapsulation layer 36 and the discontinuous dielectric crossover layer 34 is localized to each one of the dielectric crossover sections 42. Accordingly, the overall stress within the semiconductor device 30 is substantially reduced.

Figure 4:
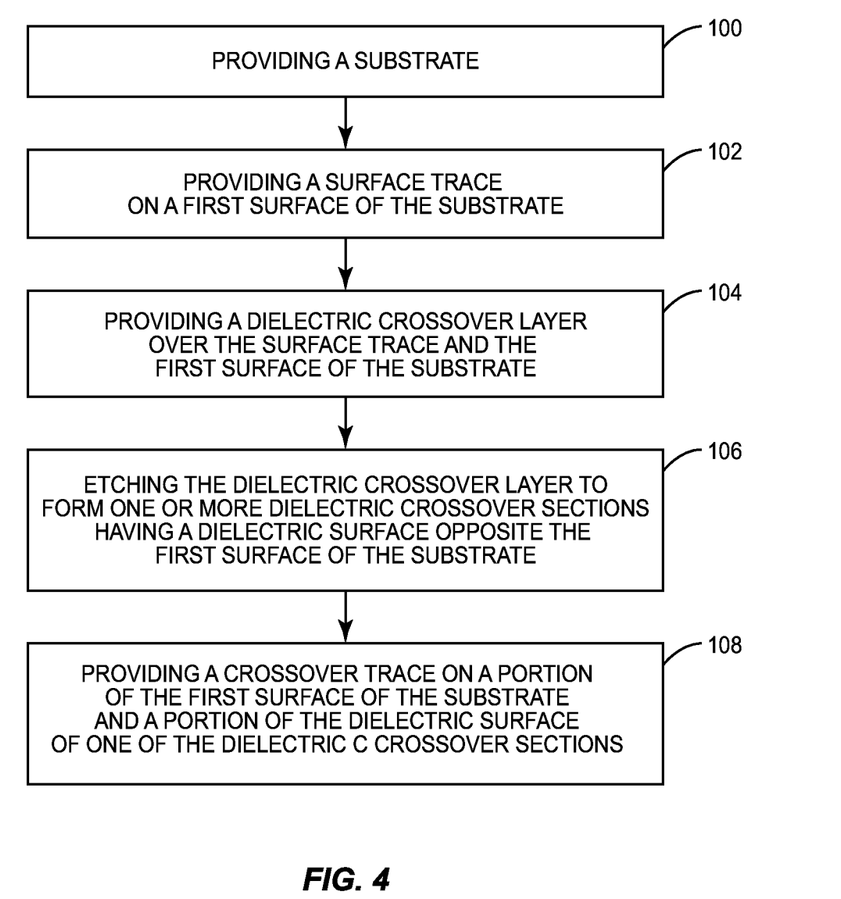
FIG. 4 shows a flow diagram illustrating a method for manufacturing the semiconductor device of FIG. 3 according to one embodiment of the present disclosure.

FIG. 4 is a flow diagram illustrating a method for manufacturing a dielectric crossover, such as the first crossover 44A shown in FIG. 3. First, a substrate (such as the substrate 32) is provided (step 100). Next, a surface trace (such as the first conductive trace 46) is provided on a first surface of the substrate (step 102). This may be done, for example, by providing a metal layer on the first surface of the substrate, then etching the metal layer to form the surface trace. A dielectric crossover layer (such as dielectric crossover layer 34) is then provided over the surface trace and the first surface of the substrate (step 104). The dielectric crossover layer is then etched to form one or more dielectric crossover sections (such as dielectric crossover section 42A). Each dielectric crossover section may include a dielectric surface opposite the first surface of the substrate (step 106). Finally, a crossover trace (such as the second conductive trace 48) is provided on a portion of the first surface of the substrate and a portion of the dielectric surface of one of the dielectric crossover sections, such that the crossover trace crosses over the surface trace on the dielectric surface.

Figure 5:
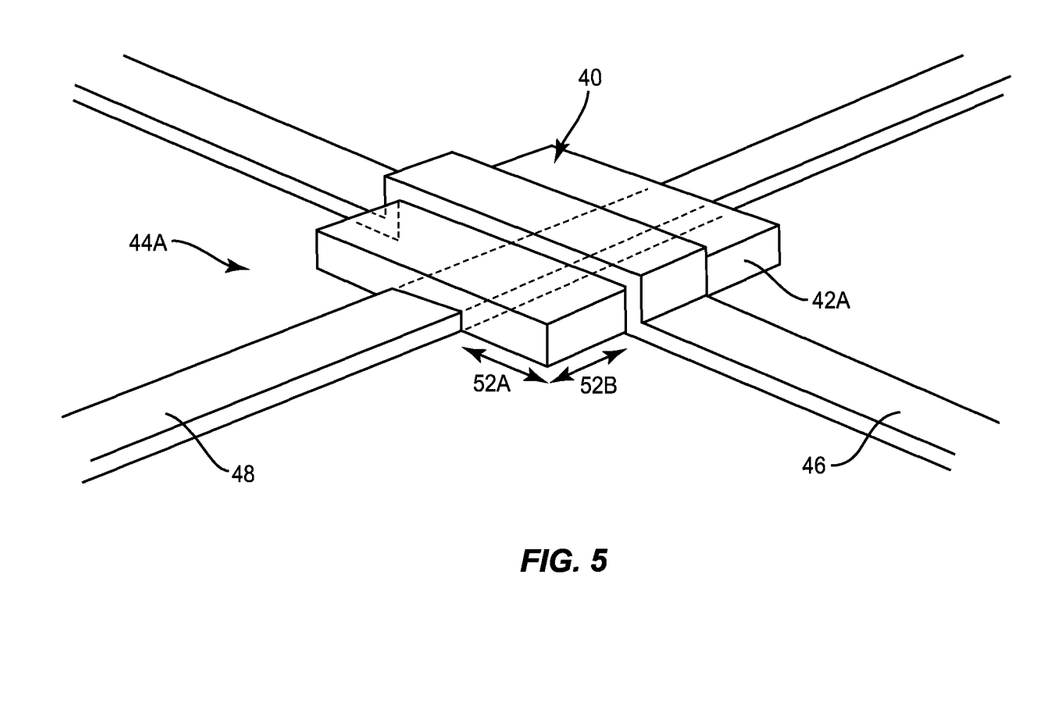
FIG. 5 shows an expanded view of a crossover shown in the semiconductor device of FIG. 3.

FIG. 5 shows details of the first crossover 44A shown in FIG. 3 according to one embodiment of the present disclosure. The first crossover 44A includes the first dielectric crossover section 42A, the first conductive trace 46, and the second conductive trace 48. As discussed above, the first conductive trace 46 is a crossover trace, which crosses over the second conductive trace 48 on the dielectric surface 40 of the first dielectric crossover section 42A, while the second conductive trace 48 is a surface trace, which runs under the first conductive trace 46 on the first surface 38 of the substrate 32. Specifically, the first conductive trace 46 is partially disposed on the first surface 38 of the substrate 32 and the dielectric surface 40 of the first dielectric crossover section 42A, such that the first conductive trace 46 crosses over the second conductive trace 48 on the dielectric surface 40. Notably, the first dielectric crossover section 42A, which separates the first conductive trace 46 and the second conductive trace 48 to prevent contact between the two, is a discrete section that is confined to the immediate vicinity of the first crossover 44A. Accordingly, the solid lines shown in FIG. 5 represent the portion of the first conductive trace 46 and the second conductive trace 48 located outside of the first dielectric crossover section 42A, while the dotted lines represent the portion of the second conductive trace 48 covered by the first dielectric crossover section 42A.

According to one embodiment, the first dielectric crossover section 42A is defined by a termination length 52A and a termination width 52B, which extend less than 15 microns beyond the confines of the area where the first conductive trace 46 crosses over the second conductive trace 48. By confining each one of the dielectric crossover sections 42 to the immediate vicinity of the crossover 44 supported by the dielectric crossover section 42, stress generated between the substrate 32 and the discontinuous dielectric crossover layer 34, as well as stress generated between the encapsulation layer 36 and the discontinuous dielectric crossover layer 34, is effectively localized to the area of each one of the dielectric crossover sections 42, thereby substantially reducing the overall stress in the semiconductor device 30.

According to one embodiment, the discontinuous dielectric crossover layer 34 occupies less than 10% of the area of the first surface 38 of the substrate 32. According to an additional embodiment, the discontinuous dielectric crossover layer 34 occupies less than 5% of the area of the first surface 38 of the substrate 32. By reducing the total area occupied by the discontinuous dielectric crossover layer 34, stress generated between the substrate 32 and the discontinuous dielectric crossover layer 34, as well as stress generated between the encapsulation layer 36 and the discontinuous dielectric crossover layer 34, is localized to the regions where the substrate 32 and the encapsulation layer 36 contact the discontinuous dielectric crossover layer 34, thereby substantially reducing the overall stress in the semiconductor device 30.

According to one embodiment, the substrate 32 comprises silicon (Si), silicon carbide (SiC), gallium nitride (GaN), gallium arsenide (GaAs), or the like. The discontinuous dielectric crossover layer 34 may comprise polyimide or a similar dielectric material suitable for supporting the one or more crossovers 44. The encapsulation layer 36 may comprise ceramic or a similar material suitable for protecting the semiconductor device 30 from one or more environmental conditions.

While only two conductive traces are shown in the first crossover 44A, those of ordinary skill in the art will appreciate that each one of the dielectric crossover sections 42 may support any number of crossover traces or surface traces without departing from the principles of the present disclosure, as illustrated in detail below. Further, although the concepts of the present disclosure are described above with reference to a substrate 32, a discontinuous dielectric crossover layer 34, and an encapsulation layer 36, those of ordinary skill in the art will appreciate that the principles of the present disclosure may be applied to any semiconductor layer capable of generating stress in the device.

Figure 6:
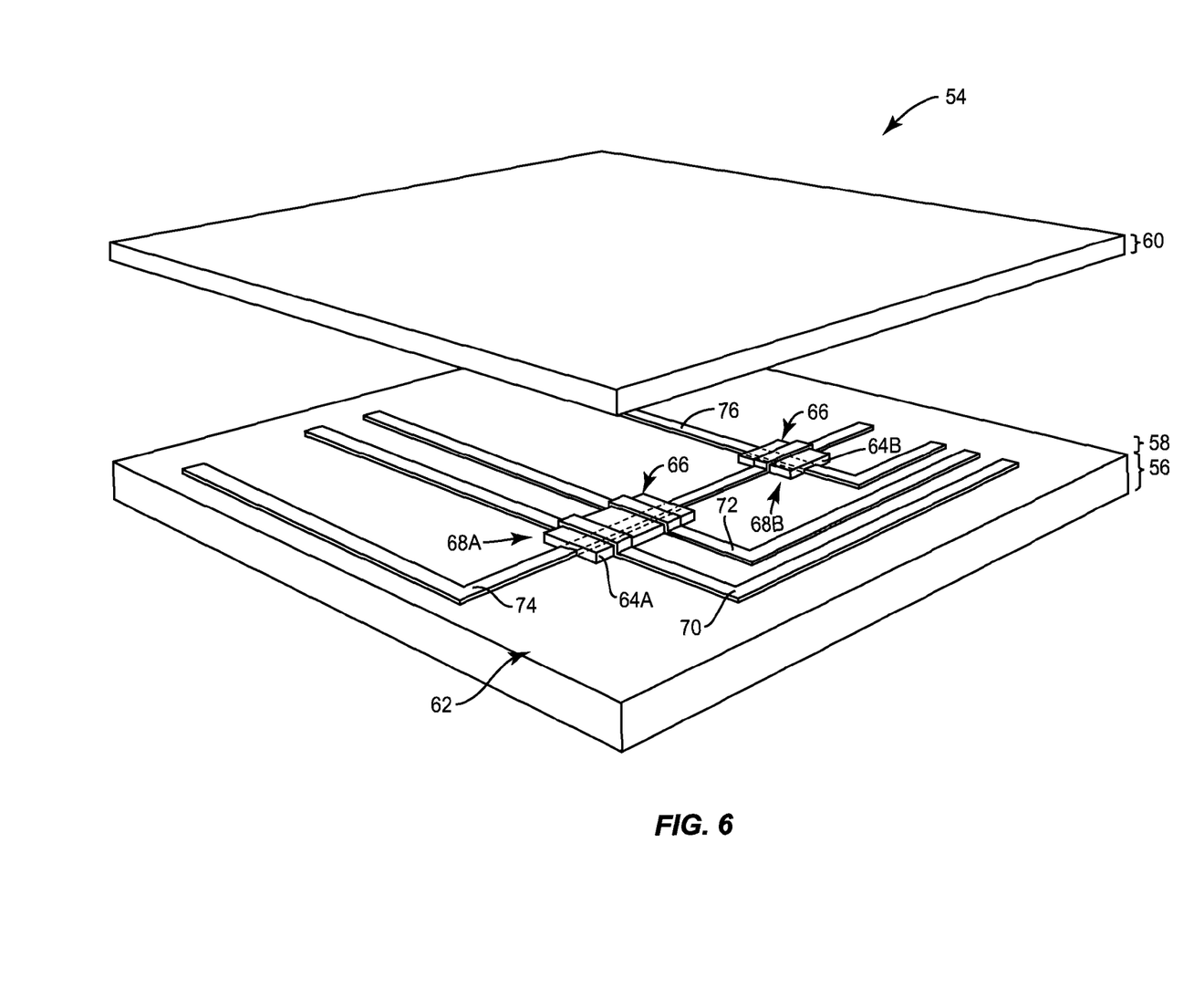
FIG. 6 shows a three-dimensional representation of a semiconductor device according to an additional embodiment of the present disclosure.

FIG. 6 shows a semiconductor device 54 according to an additional embodiment of the present disclosure. The semiconductor device 54 includes a substrate 56, a discontinuous dielectric crossover layer 58, and an encapsulation layer 60. The substrate 56 includes a first surface 62, which is used to support and connect one or more electrical components (not shown). The discontinuous dielectric crossover layer 58 is located between the first surface 62 of the substrate 56 and the encapsulation layer 60. Further, the discontinuous dielectric crossover layer 58 is broken into a number of dielectric crossover sections 64, each of which includes a dielectric surface 66 opposite the first surface 62 of the substrate 56 and used to support one or more crossovers 68, such as a first crossover 68A and a second crossover 68B.

As discussed above, each one of the dielectric crossover sections 64 may support a plurality of conductive traces. To illustrate this fact, the first crossover 68A is shown including a first dielectric crossover section 64A, a first conductive trace 70, a second conductive trace 72, and a third conductive trace 74. The second crossover 68B may include a second dielectric crossover section 64B, the third conductive trace 74, and a fourth conductive trace 76. In the first crossover 68A, the first conductive trace 70 and the second conductive trace 72 may be crossover traces, while the third conductive trace 74 may be a surface trace, such that that first conductive trace 70 and the second conductive trace 72 cross over the third conductive trace 74 on the dielectric surface 66 of the first dielectric crossover section 64A. Accordingly, the first dielectric crossover section 64A supports more than one crossover trace in the present embodiment. In the second crossover 68B, the third conductive trace 74 may be a crossover trace, and the fourth conductive trace 76 may be a surface trace, such that the third conductive trace 74 crosses over the fourth conductive trace 76 on the dielectric surface 66 of the second dielectric crossover section 64B.

According to one embodiment, the first dielectric crossover section 64A extends less than 15 microns beyond the confines of the area wherein the first conductive trace 70 and the second conductive trace 72 cross over the third conductive trace 74. By confining each one of the dielectric crossover sections 64 to the immediate vicinity of the crossover 68 supported by the dielectric crossover section 64, stress generated between the substrate 56 and the discontinuous dielectric crossover layer 58, as well as stress generated between the encapsulation layer 60 and the discontinuous dielectric crossover layer 58, is effectively localized to the area of each one of the dielectric crossover sections 64, thereby substantially reducing the overall stress in the semiconductor device 54.

According to one embodiment, the discontinuous dielectric crossover layer 58 occupies less than 10% of the area of the first surface 62 of the substrate 56. According to an additional embodiment, the discontinuous dielectric crossover layer 58 occupies less than 5% of the area of the first surface 62 of the substrate 56. By reducing the total area occupied by the discontinuous dielectric layer, stress generated between the substrate 56 and the discontinuous dielectric crossover layer 58, as well as stress generated between the encapsulation layer 60 and the discontinuous dielectric crossover layer 58, is effectively localized to the area of each one of the dielectric crossover sections 64, thereby substantially reducing the overall stress in the semiconductor device 54.

According to one embodiment, the substrate 56 comprises silicon (Si), silicon carbide (SiC), gallium nitride (GaN), gallium arsenide (GaAs), or the like. The discontinuous dielectric crossover layer 58 may comprise polyimide or a similar dielectric material suitable for supporting the one or more crossovers 68. The encapsulation layer 60 may comprise ceramic or a similar material suitable for protecting the semiconductor device 54 from one or more environmental conditions.

While only three conductive traces are shown in the first crossover 68A, those of ordinary skill in the art will appreciate that each one of the dielectric crossover sections 64 may support any number of crossover traces or surface traces without departing from the principles of the present disclosure. Further, although the concepts of the present disclosure are described above with reference to a substrate 56, a discontinuous dielectric crossover layer 58, and an encapsulation layer 60, those of ordinary skill in the art will appreciate that the principles of the present disclosure may be applied to any semiconductor layer capable of generating stress in the device.

Figure 7:
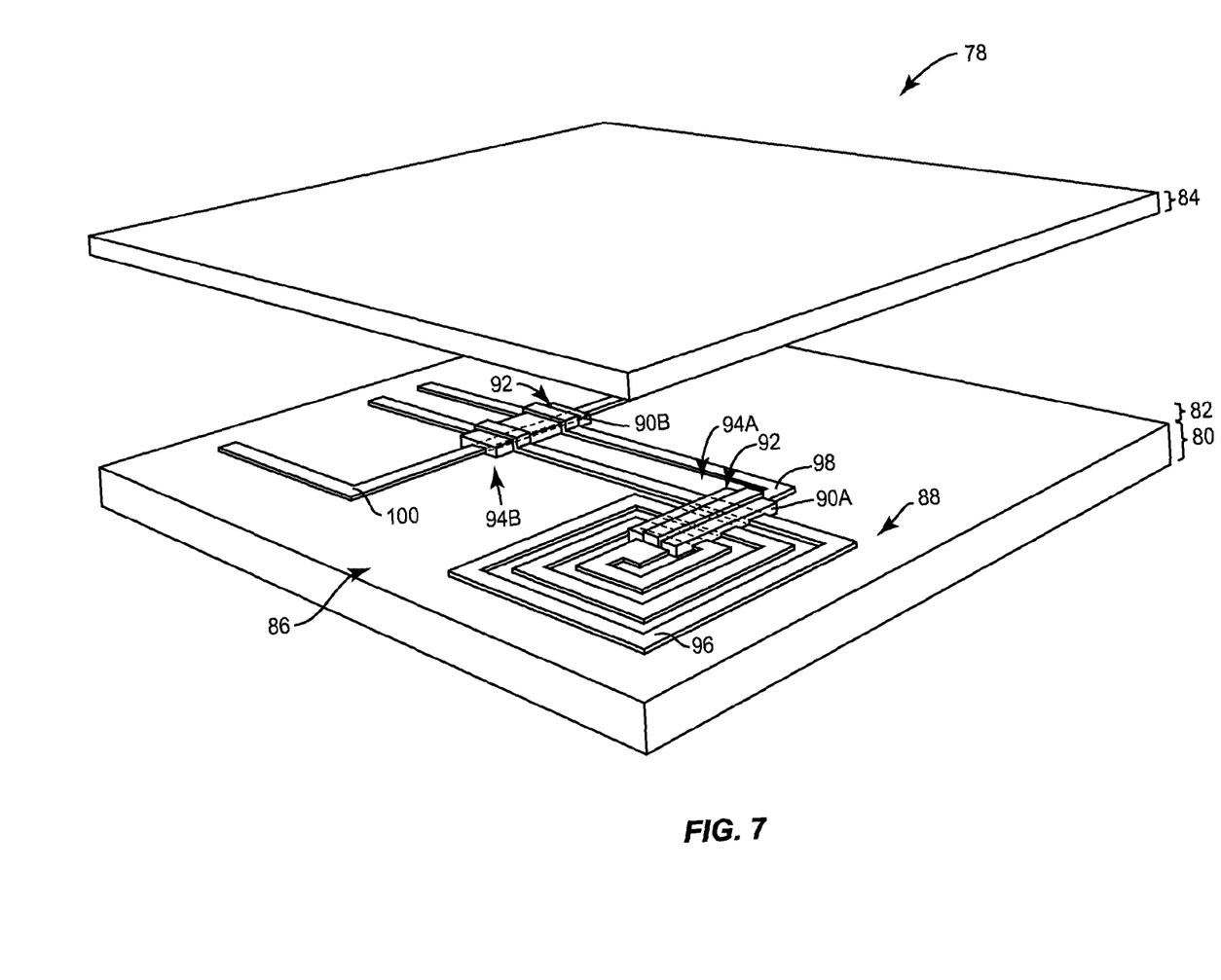
FIG. 7 shows a cross-sectional representation of a semiconductor device according to an additional embodiment of the present disclosure.

FIG. 7 shows a semiconductor device 78 according to an additional embodiment of the present disclosure. The semiconductor device 78 includes a substrate 80, a discontinuous dielectric crossover layer 82, and an encapsulation layer 84. The substrate 80 includes a first surface 86, which is used to support and connect one or more electrical components, such as a spiral inductor 88. The discontinuous dielectric crossover layer 82 is broken into a number of dielectric crossover sections 90, each of which includes a dielectric surface 92 opposite the first surface 86 of the substrate 80 and used to support one or more crossovers 94, such as a first crossover 94A and a second crossover 94B.

In the embodiment shown in FIG. 7, a first conductive trace 96 and a second conductive trace 98 form the spiral inductor 88 on the first surface 86 of the substrate 80. Accordingly, the first conductive trace 96 may be arranged in a spiral configuration, with the second conductive trace 98 forming an interconnect between the innermost portion of the spiral and an external connection point, such that a first dielectric crossover section 90A supports the second conductive trace 98 as it crosses over each one of the spiraling portions of the first conductive trace 96. The first conductive trace 96 and the second conductive trace 98 may further cross over a third conductive trace 100. Accordingly, a second dielectric crossover section 90B may support the first conductive trace 96 and the second conductive trace 98 as they cross over the third conductive trace 100.

According to one embodiment, the first dielectric crossover section 90A extends less than 15 microns beyond the confines of the area wherein the second conductive trace 98 crosses over the first conductive trace 96. By confining each one of the dielectric crossover sections 90 to the immediate vicinity of the crossover 94 supported by the dielectric crossover section 90, stress generated between the substrate 80 and the discontinuous dielectric crossover layer 82, as well as stress generated between the encapsulation layer 84 and the discontinuous dielectric crossover layer 82, is effectively localized to the area of each one of the dielectric crossover sections 90, thereby substantially reducing the overall stress in the semiconductor device 78.

According to one embodiment, the discontinuous dielectric crossover layer 82 occupies less than 10% of the area of the first surface 86 of the substrate 80. According to an additional embodiment, the discontinuous dielectric crossover layer 82 occupies less than 5% of the area of the first surface 86 of the substrate 80. By reducing the total area occupied by the discontinuous dielectric crossover layer 82, stress generated between the substrate 80 and the discontinuous dielectric crossover layer 82, as well as stress generated between the encapsulation layer 84 and the discontinuous dielectric crossover layer 82, is effectively localized to the area of each one of the dielectric crossover sections 90, thereby substantially reducing the overall stress in the semiconductor device 78.

According to one embodiment, the substrate 80 comprises silicon (Si), silicon carbide (SiC), gallium nitride (GaN), gallium arsenide (GaAs), or the like. The discontinuous dielectric crossover layer 82 may comprise polyimide or a similar dielectric material suitable for supporting the one or more crossovers 94. The encapsulation layer 84 may comprise ceramic or a similar material suitable for protecting the semiconductor device 78 from one or more environmental conditions.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
a semiconductor substrate; and
a discontinuous dielectric layer on a first surface of the semiconductor substrate, the discontinuous dielectric layer being broken into one or more dielectric crossover sections such that the discontinuous dielectric layer covers less than 10% of the first surface of the semiconductor substrate in order to relieve stress in the semiconductor device.

2. The semiconductor device of claim 1 wherein the discontinuous dielectric layer is a dielectric crossover layer for supporting one or more crossovers in the semiconductor device.

3. The semiconductor device of claim 2 wherein each of the one or more crossovers in the semiconductor device comprises:
a surface trace on a first surface of the semiconductor substrate;
a dielectric crossover section covering a portion of the surface trace and having a dielectric surface opposite the first surface of the semiconductor substrate; and
a crossover trace partially disposed on a portion of the surface of the semiconductor substrate and a portion of the dielectric surface, such that the crossover trace crosses over the surface trace on the dielectric surface.

4. The semiconductor device of claim 3 wherein the dielectric crossover section of each of the one or more crossovers forms the discontinuous dielectric layer.

5. The semiconductor device of claim 1 wherein the discontinuous dielectric layer covers less than 5% of a first surface of the semiconductor substrate.

6. The semiconductor device of claim 1 wherein the discontinuous dielectric layer is polyimide.

7. The semiconductor device of claim 1 further comprising a substantially continuous encapsulation layer over the first surface of the semiconductor substrate and the one or more dielectric crossover sections.

8. The semiconductor device of claim 7 wherein the discontinuous dielectric layer is polyimide and the substantially continuous encapsulation layer is ceramic.

9. The semiconductor device of claim 7 wherein the substantially continuous encapsulation layer is ceramic.

10. The semiconductor device of claim 7 wherein the discontinuous dielectric layer is polyimide and the substantially continuous encapsulation layer is polyimide.

11. A semiconductor device comprising:
a semiconductor substrate;
one or more crossovers, each of the one or more crossovers comprising:
a surface trace on a first surface of the semiconductor substrate;
a dielectric crossover section covering a portion of the surface trace and having a dielectric surface opposite the first surface of the semiconductor substrate; and
a crossover trace partially disposed on a portion of the surface of the semiconductor substrate and a portion of the dielectric surface, such that the crossover trace crosses over the surface trace on the dielectric surface;
wherein the dielectric crossover section of each of the one or more crossovers forms a discontinuous dielectric crossover layer covering less than 10% of the first surface of the semiconductor substrate.

12. The semiconductor device of claim 11 wherein the discontinuous dielectric crossover layer comprises polyimide.

13. The semiconductor device of claim 11 further comprising a substantially continuous encapsulation layer over the one or more crossovers and the first surface of the semiconductor substrate.

14. The semiconductor device of claim 13 wherein the substantially continuous encapsulation layer comprises ceramic.

15. The semiconductor device of claim 13 wherein the discontinuous dielectric crossover layer comprises polyimide and the substantially continuous encapsulation layer comprises ceramic.

16. The semiconductor device of claim 11 wherein a plurality of crossover traces are partially disposed on a portion of the first surface of the semiconductor substrate and a portion of the dielectric surface, such that each one of the crossover traces crosses over the surface trace on the dielectric surface.

17. The semiconductor device of claim 11 wherein the dielectric crossover section covers a plurality of surface traces, such that the crossover trace crosses over each one of the surface traces on the dielectric surface.

18. The semiconductor device of claim 11 wherein:
the dielectric crossover section covers a plurality of surface traces; and
a plurality of crossover traces are partially disposed on a portion of the first surface of the semiconductor substrate and a portion of the dielectric surface, such that each one of the crossover traces crosses over each one of the surface traces on the dielectric surface.

19. The semiconductor device of claim 11 wherein the dielectric crossover layer covers less than 5% of the first surface of the semiconductor substrate.

20. A method of manufacturing a semiconductor device comprising:
providing a semiconductor substrate;
providing a surface trace on a first surface of the semiconductor substrate;

providing a dielectric crossover layer over the surface trace and the first surface of the semiconductor substrate;

etching the dielectric crossover layer to form one or more dielectric crossover sections having a dielectric surface opposite the first surface of the semiconductor substrate, such that the one or more dielectric crossover sections form a discontinuous dielectric crossover layer covering less than 10% of the first surface of the semiconductor substrate; and providing a crossover trace on a portion of the first surface of the semiconductor substrate and a portion of the dielectric surface of one of the dielectric crossover sections, such that the crossover trace crosses over the surface trace on the dielectric surface.

21. The method of claim 20 wherein the discontinuous dielectric crossover layer comprises polyimide.

22. The method of claim 20 further comprising providing a substantially continuous encapsulation layer over the discontinuous dielectric crossover layer and the first surface of the semiconductor substrate.

23. The method of claim 22 wherein the substantially continuous encapsulation layer comprises ceramic.

24. The method of claim 22 wherein the discontinuous dielectric crossover layer comprises polyimide and the substantially continuous encapsulation layer comprises ceramic.

25. The method of claim 20 wherein a plurality of crossover traces are partially disposed on the portion of the first surface of the semiconductor substrate and the portion of the dielectric surface, such that each one of the plurality of crossover traces crosses over the surface trace on the dielectric surface.

26. The method of claim 20 wherein the one or more dielectric crossover sections covers a plurality of surface traces, such that the crossover trace crosses over each one of the surface traces on the dielectric surface.

27. The method of claim 20 wherein:

the one or more dielectric crossover sections covers a plurality of surface traces; and a plurality of crossover traces are partially disposed on a portion of the first surface of the semiconductor substrate and a portion of the dielectric surface, such that each one of the plurality of crossover traces crosses over each one of the plurality of surface traces on the dielectric surface.

28. The method of claim 20 wherein the dielectric crossover layer covers less than 5% of the first surface of the semiconductor substrate.

* * * * *